(12) United States Patent
Lin et al.

(10) Patent No.: US 9,978,656 B2
(45) Date of Patent: May 22, 2018

(54) MECHANISMS FOR FORMING FINE-PITCH COPPER BUMP STRUCTURES

(75) Inventors: Tsung-Shu Lin, New Taipei (TW);
Han-Ping Pu, Taichung (TW);
Ming-Da Cheng, Jhubei (TW);
Chang-Chia Huang, Hsinchu (TW);
Hao-Juin Liu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days. days.

(21) Appl. No.: 13/406,270

(22) Filed: Feb. 27, 2012

(65) Prior Publication Data
US 2013/0127045 A1    May 23, 2013

Related U.S. Application Data

(60) Provisional application No. 61/562,590, filed on Nov. 22, 2011.

(51) Int. Cl.
*H01L 23/00* (2006.01)
*H01L 23/29* (2006.01)
(Continued)

(52) U.S. Cl.
CPC .......... *H01L 23/293* (2013.01); *H01L 21/568* (2013.01); *H01L 23/3157* (2013.01); *H01L 24/05* (2013.01); *H01L 24/13* (2013.01); *H01L 24/02* (2013.01); *H01L 24/03* (2013.01); *H01L 24/04* (2013.01); *H01L 24/06* (2013.01); *H01L 24/10* (2013.01); *H01L 24/11* (2013.01); *H01L 24/12* (2013.01); *H01L 24/14* (2013.01); *H01L 2224/0346* (2013.01); *H01L 2224/0347* (2013.01); *H01L 2224/0401* (2013.01); *H01L 2224/05541* (2013.01); *H01L 2224/05572* (2013.01); *H01L 2224/05647* (2013.01); *H01L 2224/10126* (2013.01); *H01L 2224/1146* (2013.01); *H01L 2224/1147* (2013.01); *H01L 2224/1181* (2013.01); *H01L 2224/1191* (2013.01); *H01L 2224/13005* (2013.01); *H01L 2224/13007* (2013.01); *H01L 2224/13022* (2013.01); *H01L 2224/13083* (2013.01); *H01L 2224/13109* (2013.01);
(Continued)

(58) Field of Classification Search
CPC .......... H01L 24/02; H01L 24/04–24/06; H01L 24/10; H01L 24/12–24/14
See application file for complete search history.

(56) References Cited

U.S. PATENT DOCUMENTS 4,999,699 A * 3/1991 Christie et al. ............... 257/778
5,773,889 A * 6/1998 Love et al. .................... 257/737
(Continued)

FOREIGN PATENT DOCUMENTS

CN        101369561        2/2009

*Primary Examiner* — David Zarneke
(74) *Attorney, Agent, or Firm* — Slater Matsil, LLP

(57) ABSTRACT

The mechanisms of forming a copper post structures described enable formation of copper post structures on a flat conductive surface. In addition, the copper post structures are supported by a molding layer with a Young's modulus (or a harder material) higher than polyimide. The copper post structures formed greatly reduce the risk of cracking of passivation layer and delamination of at the dielectric interface surrounding the copper post structures.

20 Claims, 7 Drawing Sheets

(51) Int. Cl.
*H01L 23/31* (2006.01)
*H01L 21/56* (2006.01)

(52) U.S. Cl.
CPC .............. *H01L 2224/13111* (2013.01); *H01L 2224/13139* (2013.01); *H01L 2224/13144* (2013.01); *H01L 2224/13155* (2013.01); *H01L 2224/13164* (2013.01); *H01L 2224/16237* (2013.01); *H01L 2224/73104* (2013.01); *H01L 2224/81193* (2013.01); *H01L 2224/81411* (2013.01); *H01L 2224/81413* (2013.01); *H01L 2224/81416* (2013.01); *H01L 2224/81439* (2013.01); *H01L 2224/81447* (2013.01); *H01L 2224/81455* (2013.01); *H01L 2924/00014* (2013.01); *H01L 2924/1305* (2013.01); *H01L 2924/1306* (2013.01); *H01L 2924/13091* (2013.01); *H01L 2924/181* (2013.01)

(56) References Cited

U.S. PATENT DOCUMENTS

| | | | | |
|---|---|---|---|---|
| 5,773,897 A * | 6/1998 | Wen et al. | | 257/778 |
| 5,976,971 A * | 11/1999 | Kinpara et al. | | 438/637 |
| 6,103,552 A * | 8/2000 | Lin | | 438/113 |
| 6,114,187 A * | 9/2000 | Hayes | | 438/106 |
| 6,118,180 A * | 9/2000 | Loo | | H01L 24/02 228/180.22 |
| 6,245,595 B1 | 6/2001 | Nguyen et al. | | 438/108 |
| 6,260,264 B1 * | 7/2001 | Chen et al. | | 29/832 |
| 6,278,192 B1 * | 8/2001 | Takigawa et al. | | 257/787 |
| 6,333,206 B1 * | 12/2001 | Ito et al. | | 438/106 |
| 6,335,571 B1 * | 1/2002 | Capote et al. | | 257/787 |
| 6,458,622 B1 * | 10/2002 | Keser et al. | | 438/106 |
| 6,479,900 B1 * | 11/2002 | Shinogi et al. | | 257/758 |
| 6,518,096 B2 * | 2/2003 | Chan et al. | | 438/118 |
| 6,590,287 B2 * | 7/2003 | Ohuchi | | H01L 21/563 228/180.22 |
| 6,600,234 B2 * | 7/2003 | Kuwabara et al. | | 257/790 |
| 6,608,389 B1 * | 8/2003 | Hashimoto | | H01L 21/768 257/118 |
| 6,636,313 B2 * | 10/2003 | Chen | | G01B 11/272 228/174 |
| 6,681,982 B2 * | 1/2004 | Tung | | 228/197 |
| 6,696,644 B1 * | 2/2004 | Chiu et al. | | 174/535 |
| 6,707,153 B2 * | 3/2004 | Kuwabara | | H01L 21/56 257/738 |
| 6,780,751 B2 * | 8/2004 | Fay | | 438/613 |
| 6,803,303 B1 * | 10/2004 | Hiatt et al. | | 438/612 |
| 6,882,050 B2 * | 4/2005 | Tanaka | | 257/737 |
| 6,989,586 B2 * | 1/2006 | Agraharam et al. | | 257/678 |
| 7,122,459 B2 * | 10/2006 | Feng | | H01L 24/11 257/E21.508 |
| 7,163,830 B2 * | 1/2007 | Salmon et al. | | 438/18 |
| 7,256,116 B2 * | 8/2007 | Hiatt et al. | | 438/612 |
| 7,271,483 B2 * | 9/2007 | Lin et al. | | 257/737 |
| 7,285,867 B2 * | 10/2007 | Matsuzaki et al. | | 257/787 |
| 7,338,890 B2 * | 3/2008 | Lee et al. | | 438/613 |
| 7,358,618 B2 * | 4/2008 | Shibata | | 257/791 |
| 7,368,817 B2 * | 5/2008 | Pendse | | H01L 21/563 257/734 |
| 7,642,646 B2 * | 1/2010 | Nakamura | | H01L 24/11 257/737 |
| 7,816,180 B2 * | 10/2010 | Mizukoshi et al. | | 438/108 |
| 7,851,265 B2 * | 12/2010 | Ito | | H01L 23/3114 257/E21.508 |
| 7,868,457 B2 * | 1/2011 | Furman et al. | | 257/762 |
| 8,008,771 B2 * | 8/2011 | Kim | | H01L 21/568 257/738 |
| 8,030,776 B2 * | 10/2011 | Yu | | H01L 23/522 257/211 |
| 8,053,908 B2 * | 11/2011 | Tanie et al. | | 257/781 |
| 8,138,018 B2 * | 3/2012 | Oi et al. | | 438/108 |
| 8,164,192 B2 * | 4/2012 | Furman et al. | | 257/762 |
| 8,227,918 B2 * | 7/2012 | Lu et al. | | 257/738 |
| 8,258,055 B2 * | 9/2012 | Hwang et al. | | 438/613 |
| 8,508,043 B2 * | 8/2013 | Daubenspeck | | H01L 23/3171 257/459 |
| 8,647,974 B2 * | 2/2014 | Topacio | | H01L 24/03 257/766 |
| 8,736,079 B2 * | 5/2014 | Chen | | H01L 23/49811 257/781 |
| 8,912,649 B2 * | 12/2014 | Wu | | H01L 23/3171 257/737 |
| 9,099,364 B1 * | 8/2015 | Hsu | | H01L 24/14 |
| 9,842,790 B2 * | 12/2017 | Huang | | H01L 21/7684 |
| 2004/0027788 A1 * | 2/2004 | Chiu | | H01L 21/563 361/329 |
| 2004/0087129 A1 * | 5/2004 | Chen | | H01L 21/76894 438/613 |
| 2004/0266160 A1 * | 12/2004 | Jao | | H01L 24/11 438/613 |
| 2005/0082670 A1 * | 4/2005 | Quinones et al. | | 257/737 |
| 2005/0215043 A1 | 9/2005 | Lee et al. | | |
| 2006/0038291 A1 * | 2/2006 | Chung | | H01L 23/3114 257/738 |
| 2007/0019346 A1 * | 1/2007 | Kim et al. | | 361/56 |
| 2007/0187825 A1 * | 8/2007 | Hashimoto | | H01L 23/3114 257/737 |
| 2007/0290343 A1 * | 12/2007 | Harada | | H01L 24/03 257/737 |
| 2008/0072407 A1 * | 3/2008 | Wong | | 29/25.03 |
| 2008/0261352 A1 * | 10/2008 | Ito | | H01L 23/3114 438/114 |
| 2008/0308935 A1 * | 12/2008 | Kim et al. | | 257/738 |
| 2009/0045513 A1 * | 2/2009 | Kim et al. | | 257/738 |
| 2010/0052189 A1 * | 3/2010 | Sakurai et al. | | 257/778 |
| 2010/0176510 A1 * | 7/2010 | Pendse | | 257/737 |
| 2010/0187688 A1 * | 7/2010 | Hochstenbach | | H01L 23/3114 257/738 |
| 2010/0230143 A1 * | 9/2010 | Buchwalter et al. | | 174/255 |
| 2011/0095422 A1 * | 4/2011 | Hashimoto | | 257/737 |
| 2011/0095431 A1 | 4/2011 | Furman et al. | | |
| 2011/0221065 A1 * | 9/2011 | Topacio | | H01L 21/563 257/773 |
| 2011/0241202 A1 * | 10/2011 | Liu | | H01L 23/552 257/737 |
| 2011/0283034 A1 * | 11/2011 | Kang | | H01L 23/525 710/305 |
| 2012/0098120 A1 * | 4/2012 | Yu | | H01L 24/13 257/737 |
| 2012/0129333 A1 * | 5/2012 | Yim | | H01L 24/11 438/613 |
| 2012/0248605 A1 * | 10/2012 | Yamaguchi | | 257/738 |
| 2012/0313236 A1 * | 12/2012 | Wakiyama | | H01L 23/544 257/734 |
| 2013/0043583 A1 * | 2/2013 | Wu | | H01L 23/3171 257/737 |
| 2013/0069225 A1 * | 3/2013 | Lin | | H01L 24/11 257/737 |
| 2013/0175685 A1 * | 7/2013 | Wu et al. | | 257/738 |
| 2013/0256876 A1 * | 10/2013 | Lee | | H01L 24/14 257/737 |
| 2014/0145327 A1 * | 5/2014 | Jeon | | H01L 24/13 257/737 |

\* cited by examiner

MECHANISMS FOR FORMING FINE-PITCH COPPER BUMP STRUCTURES

CROSS-REFERENCE TO RELATED APPLICATIONS

The present application claims priority of U.S. Provisional Patent Application No. 61/562,590, filed on Nov. 22, 2011, which is incorporated herein by reference in its entirety.

TECHNICAL FIELD

This disclosure relates to the fabrication of semiconductor devices, and more particularly, to mechanisms of forming a copper bump structure.

BACKGROUND

Modern integrated circuits are made up of literally millions of active and/or passive devices such as transistors, capacitors, inductors, etc. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding.

Flip-chip packaging utilizes bumps to establish electrical contact between a chip's input/output (I/O) pads and the substrate or lead frame of the package. Structurally, a bump may contain the bump itself and a so-called under bump metallurgy (UBM) located between the bump and an I/O pad. The UBM may contain an adhesion layer, a barrier layer and/or a wetting layer. The bumps themselves, based on the material used, may be classified as solder bumps, gold bumps, copper pillar (or post) bumps, bumps with mixed metals, etc. However, there are challenges related to the formation and utilization of copper bump structures.

BRIEF DESCRIPTION OF THE DRAWINGS

The aforementioned objects, features and advantages of this disclosure will become apparent by referring to the following detailed description of the preferred embodiments with reference to the accompanying drawings, wherein.

DETAILED DESCRIPTION OF ILLUSTRATIVE EMBODIMENTS

This disclosure provides mechanisms of forming copper post (or bump) structures, which may be used in semiconductor device packaging, applied to flip-chip assembly, wafer-level chip scale package (WLCSP), three-dimensional integrated circuit (3D-IC) stack, and/or any advanced package technology fields. In the following description, numerous specific details are set forth to provide a thorough understanding of the disclosure. However, one having an ordinary skill in the art will recognize that the disclosure can be practiced without these specific details. In some instances, well-known structures and processes have not been described in detail to avoid unnecessarily obscuring the disclosure. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Copper interconnect post technology using copper post (or copper pillar bumps) has recently been created. Instead of using solder bump, the electronic component is connected to a substrate by means of copper posts. The copper interconnect post technology enables finer pitch with minimum probability of bump bridging, reduces the capacitance load for the circuits and allows the electronic component to perform at higher frequencies. A solder alloy may still be necessary for capping the bump structure and jointing electronic components as well.

Figure 1:
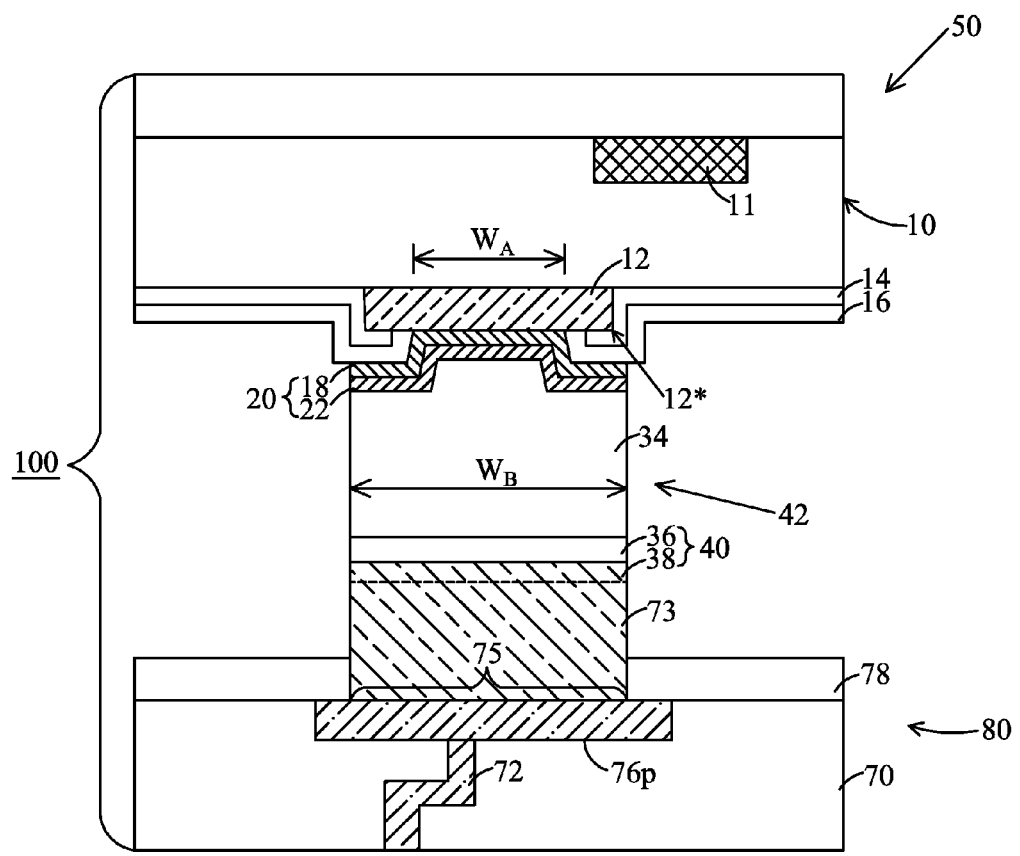
FIG. 1 shows a package assembly, in accordance with some embodiments.

FIG. 1 shows a package assembly 100, in accordance with some embodiments. The package assembly 100 includes a chip 50 bonded to a work piece 80. Chip 50 includes a substrate 10 as employed in a semiconductor integrated circuit fabrication, and integrated circuits may be formed therein and/or thereupon. The semiconductor substrate is defined to mean any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements, such as element 11. Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Chip 50 (or substrate 10) includes inter-layer dielectric layers (not shown) and interconnect structures (not shown)

connecting microelectronic elements. The inter-layer dielectric layers and interconnect structures are over the various microelectronic elements, such as element 11, in accordance with some embodiments. The inter-layer dielectric layers may include low-k dielectric materials, un-doped silicate glass (USG), silicon nitride, silicon oxynitride, or other commonly used materials. The dielectric constants (k value) of the low-k dielectric materials may be less than about 3.9, or less than about 2.5. Metal lines and vias/contacts in the interconnect structures may be formed of or include copper or copper alloys. One skilled in the art will realize the formation details of the interconnect structures and inter-layer dielectric layers.

FIG. 1 shows a conductive region 12, which could be a top metal layer of interconnect structures or a redistribution layer (RDL) deposited over a top metal layer. Suitable materials for the conductive region 12 may include, but are not limited to, for example copper (Cu), aluminum (Al), AlCu, copper alloy, or other mobile conductive materials. The conductive region 12 may also be called a metal pad region (or metal pad), which is used in the bonding process to connect the integrated circuits in the chip 50 to external features, which in this case is work piece 80.

FIG. 1 also depicts a passivation layer 14 formed over the substrate 10 and patterned to form an opening exposing a portion of the conductive region 12 for allowing subsequent bump formation. In one embodiment, the passivation layer 14 is formed of a non-organic material selected from un-doped silicate glass (USG), silicon nitride, silicon oxynitride, silicon oxide, and combinations thereof. In another embodiment, the passivation layer 14 is formed of a polymer layer, such as an epoxy, polyimide, benzocyclobutene (BCB), polybenzoxazole (PBO), and the like, although other relatively soft, often organic, dielectric materials can also be used. In some embodiments, another passivation layer is formed under conductive region 12, if the conductive region 12 is an RDL. The other passivation layer may be used to protect the interconnect structures underneath from moisture.

FIG. 1 further depicts a polymer layer 16 that is formed over the passivation layer 14 and patterned to form another opening exposing a portion of the conductive region 12 for allowing subsequent bump formation. The other opening may be smaller than, equal to, or greater than the opening of passivation layer 14 described above. In one embodiment, the other opening is positioned within the opening of passivation layer 14, as shown in FIG. 1. The polymer layer 16 is formed of a polymer, such as an epoxy, polyimide, benzocyclobutene (BCB), polybenzoxazole (PBO), and the like, although other relatively soft, often organic, dielectric materials can also be used. In one embodiment, the polymer layer 16 is a polyimide layer. In another embodiment, the polymer layer 16 is a polybenzoxazole (PBO) layer. The polymer layer 16 is soft, and hence has the function of reducing inherent stresses on substrate. In addition, the polymer layer 16 is easily formed to a thickness of tens of microns.

FIG. 1 also shows an under-bump-metallurgy (UBM) layer 20 formed over polymer layer 16, in accordance with some embodiments. UBM layer 20 may include a first UBM layer 18 formed on the polymer layer 16 and the exposed portion of the metal pad region 12. The first UBM layer 18 also lines the sidewalls and bottom of the other opening in polymer layer 16. The first UBM layer 18, also referred to as a diffusion barrier layer, may be formed of titanium (Ti), titanium nitride (TiN), tantalum nitride (TaN), tantalum (Ta), or the like. The first UBM layer 18 is deposited to a thickness in a range from about 500 Angstroms to about 2000 Angstroms, in accordance with some embodiments. A second UBM layer 22 may be formed on the first UBM layer 18. The second UBM layer 22, also referred to as a copper seed layer, may have a thickness ranging from about 0.1 μm to about 1 μm, for example about 0.5 μm, although the thickness may be greater or smaller. In some embodiments, the second UBM layer 22 is a copper layer containing palladium (Pd) elements.

FIG. 1 shows that a copper layer 34 is formed to contact the underlying second UBM layer 22. The copper layer 34 is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. In some embodiments, a thickness of the copper layer 34 is greater than about 30 μm. In some other embodiments, the thickness of the copper layer 34 is greater than about 40 μm. For example, the copper layer 34 is about 40 μm to about 50 μm thick, or about 40 μm to about 70 μm thick, although the thickness may be greater or smaller. The copper layer 34 is referred to as a copper post 34 hereinafter.

FIG. 1 also shows a cap layer 40 being formed on the top surface of the copper post 34, in some embodiments. The cap layer 40 may include a sub layer 36, which may act as a barrier layer to prevent copper in the copper post 34 from diffusing into bonding material, such as solder alloy, that is used to bond the substrate 10 to external features. The prevention of copper diffusion increases the reliability and bonding strength of the package. The cap layer 40 may also include a sub layer 38, which may include nickel, tin, tin-lead (SnPb), gold (Au), silver (Ag), palladium (Pd), indium (In), nickel-palladium-gold (NiPdAu), nickel-gold (NiAu), other similar materials, or alloys. The sub layer 38 may be a multi-layered structure or a single-layered structure. In some embodiments, the first cap layer 36 is a nickel layer with a thickness ranging from about 1 μm to about 5 μm. In some embodiments, the second cap layer 38 is a solder layer or a gold (Au) layer. In some embodiments, the cap layer 40 only includes layer 36. In some embodiments, the cap layer 40 is omitted. In some embodiments, the completed bump structure 42 includes the first UBM layer 18, the second UBM layer 22, the copper post 34, and the cap layer 40.

FIG. 1 shows that chip 50 is bonded to the work piece 80. Work piece 80 includes a substrate 70, which may be a package substrate, a printed circuit board (PCB), a wafer, a die, an interposer substrate, a dielectric substrate, or other suitable substrate. The substrate 70 may include a plurality of conductive traces electrically connected to underlying metal interconnection 72. The conductive traces may be formed of substantially pure copper (Cu), aluminum-copper alloy (AlCu), or other metallic materials such as tungsten (W), nickel (Ni), palladium (Pd), gold (Au), and alloys thereof. Some areas of the conductive traces are defined as landing pad regions $76_P$ for electrically connecting to the copper pillar bump structure 42. In an embodiment, a mask layer 78 is formed and patterned on the substrate 70 to cover portions of the conductive traces, while other portions of the conductive traces are not covered, such as region (or mask opening) 75. The mask layer 78 may be formed of a solder resist material layer, a dielectric layer, a polymer layer, or any other materials that are resistant to solder materials. The mask layer 78 with the mask opening 75 provides a window for solder jointing bump structures on other substrate. For example, a solder layer 73, which may include alloy of tin (Sn), lead (Pb), silver (Ag), copper (Cu), nickel (Ni), bismuth (Bi), or combinations thereof, is provided over opening 75 of the landing pad region $76_P$.

The metal pad region 12, passivation layers (14 and 16), and copper bump (or copper pillar) structure 42 described above enable chip 50 to be bonded to work piece 80. However, such bonding scheme has the risk of cracking at passivation layer 14 near corners 12* of the conductor region 12 and interfacial delamination (not shown) between dielectric layers and upper metal layers of interconnect structures near the copper pillar structure 42. The cracking and delamination are caused by high stress of the bonding structures and the materials around them. One of the main causes of high stress is a mismatch of coefficients of thermal expansion (CTE) of different materials in the bonding structures. For example, silicon substrates have CTEs of about 3 ppm/° C., low-k dielectric materials used to isolate interconnect structures may have CTEs of about 20 ppm/° C., while package substrates may have CTEs of about 17 ppm/° C. The significant difference in CTEs results in stress being applied to the bonding structures and the materials around them. The use of copper pillars further worsens the cracking and delamation problems, because copper is a rigid material. The stress caused by the thermal expansion mismatch is translated directly into the structures near the copper pillars (or posts) structure 42.

Figure 2A:
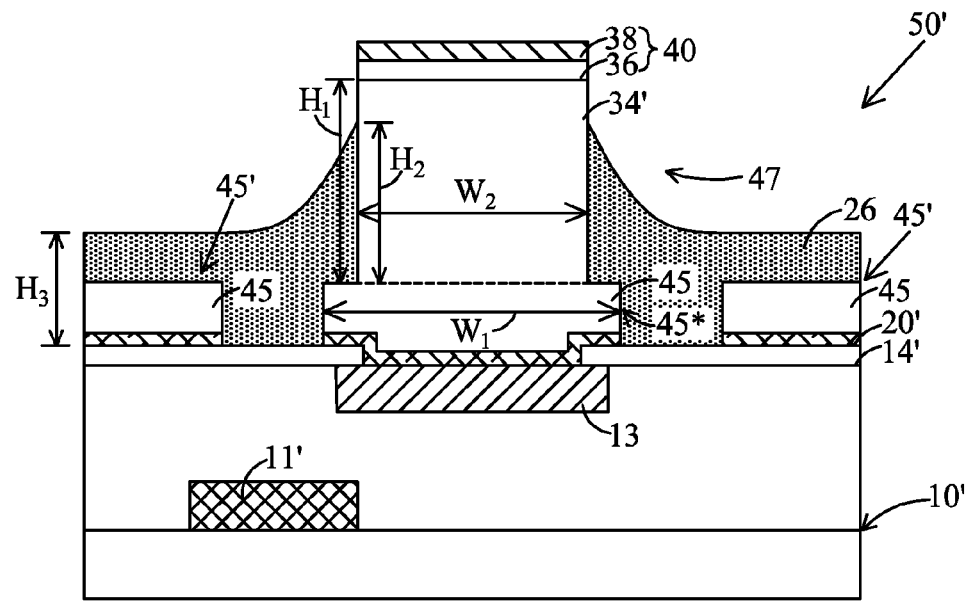
FIG. 2A shows a semiconductor chip with a copper post structure, in accordance with some embodiments.

FIG. 2A shows a semiconductor chip 50' with a bump structure 47, in accordance with some embodiments. The semiconductor chip 50' includes a substrate 10', which is similar substrate 10 described above. Substrate 10' includes element 11' and a conductive layer 13, which may include Al, Al alloy, Cu, Cu alloy, or other suitable conductive material. The conductive layer 13 may be a metal layer or a RDL. A passivation layer 14' is formed the substrate 10' to cover a portion of the conductive layer 13 and to leave the remaining portion of conductive layer 13 open. FIG. 2A shows that the passivation layer 14' covers the edges of conductive layer 13 and leaves the center portion of the conductive layer 13 open, in accordance with some embodiments. The passivation layer 14' may be made of a material similar to passivation layer 14 described above. In some embodiments, passivation layer 14' has a thickness in a range from about 0.5 μm to about 2.5 μm.

Over the passivation layer 14', an UBM layer 20' is formed, in accordance with some embodiments. The UBM layer 20' is similar to UBM layer 20 described above. A conductive layer 45 is formed over the UBM layer 20'. The conductive layer 45 may be a top metal layer or an RDL. The conductive layer 45 may be made of Cu, a Cu alloy, or a combination thereof. The conductive layer 45 has a thickness in a range from about 2 μm to about 15 in some embodiments. A copper post 34' is formed over the conductive layer 45. Copper post 34' is formed by a process similar to copper post 34 described above. The copper post 34' has a thickness in a range from about 10 μm to about 80 in some embodiments.

As described above, the first cap layer 36 may be a nickel layer with a thickness in a range from about 0.5 μm to about 5 μm. In some embodiments, the second cap layer 38 may be a solder layer or a gold (Au) layer with a thickness in a range from about 5 μm to about 35 μm. In some embodiments, the cap layer 40 only includes layer 36. In some other embodiments, there is no cap layer 40. In some embodiments, the copper post structure 47 includes the copper post 34', and the cap layer 40.

A molding layer 26 is formed to surround the copper post 34' and to cover the conductive layer 45. In some embodiments, a portion of the conductive layer 45 is exposed, such as conductive layer region 45' not under the copper post 34'. Molding layer 26 is made of a liquid molding compound, in accordance with some embodiments. The liquid molding compound is dispensed on the substrate and is dried to form the molding layer 26 shown in FIG. 2A. The molding layer 26 is made of a material with a Young's modulus higher than the polymer layer 16 described in FIG. 1. As mentioned above, the polymer layer 16 of FIG. 1 may be made of polyimide, which has a Young's modulus of about 3.2 GPa. The polymer layer 16 described above needs to be relatively soft to cushion forces exerted on the bump structure 42. However, the copper post structure 47 is different from copper post structure 42. The copper post 34 has a narrow base with a width $W_A$, which is narrower than the width $W_B$ of the remaining copper post 34. In contrast, the copper post 34' of copper post structure 47 has a width $W_2$, which is also the width of the base of copper post 34'. As a result, the stress endured by the copper post 34' is distributed over the width $W_2$ of the copper post 34'. As a result, the stress experienced near the base of the copper post structure 47 is lower than the stress experienced near the base of copper post structure 42. In addition, with the design shown in FIG. 2A, the copper post structure 47 does not need the cushion of a polymer layer. Instead, a molding layer 26 is used. The higher Young's modulus of the molding layer 26 (a hard film) provides structural support for the copper post structure 47 and reduces the stress experienced by the bump structure.

In some embodiments, the Young's modulus of the molding layer 26 is in a range from about 5 GPa to about 25 GPa. Although the Young's modulus of the molding layer 26 is higher than the polymer layer 16, the Young's modulus of the molding layer 26, which reflects hardness, cannot be too high. The coefficient of thermal expansion (CTE) of the molding layer 26 is in a range from about 20 ppm/° C. to about 60 ppm/° C., in accordance with some embodiments. The molding layer 26 may be made of thermosetting plastics, which do not change shape after formation. An exemplary material of molding layer 26 is epoxy resin. However, non-thermosetting plastics may also be used. After the molding layer 26 is formed, there could be other thermal processes performed on the chip package. The temperatures of such thermal processes could be in a range from about 200° C. to about 260° C. Any thermosetting plastics or thermal plastics may be used to form the molding layer 26, as long as the molding layer 26 does not deform and maintains the Young's modulus during the subsequent thermal processes.

Figure 2B:
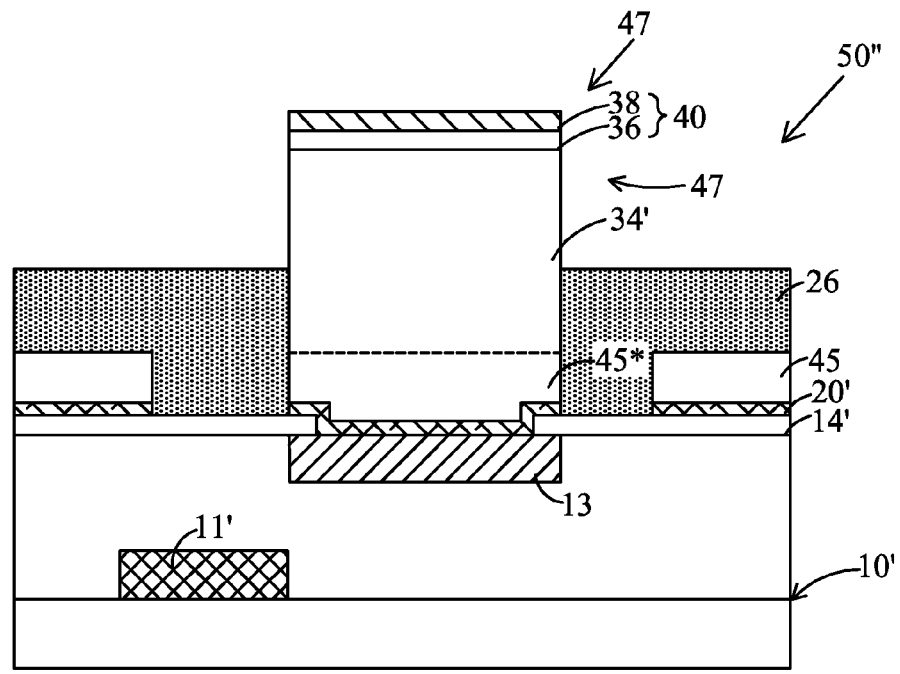
FIG. 2B shows a semiconductor chip with a copper post structure, in accordance with some embodiments.

Copper post 34' is disposed over a portion 45* of conductive layer 45, which has a width $W_1$. In some embodiments, width $W_2$ is narrower than width $W_1$. In some other embodiments, width $W_2$ is equal to width $W_1$, as shown in FIG. 2B. The molding layer 26 may have various profiles surrounding the copper post structure 47. FIGS. 2A and 2B show two different profiles. Other shapes and profiles are also possible. In some embodiments, width $W_2$ is in a range from about 10 μm to about 105 μm. Without the narrower base, such as $W_A$ of FIG. 1, the risk of concentrated stress at a base of copper post 34' is reduced with respect to the base of copper post 34. As a result, the width $W_2$ can be made narrower than $W_B$ of FIG. 1. Similarly, a pitch of the bump structure, which is the shortest distance between neighboring bump structures, can be made narrower than the structure shown in FIG. 1. In some embodiments, the pitch is in a range from about 40 μm to about 180 μm. In some embodiments, width $W_1$ is in a range from about 10 µm to about 105 µm. The height $H_1$ of the copper post 34' is in a range from about 30 µm to about 60 µm.

The height $H_2$ of the molding layer 26 in a region surrounding the copper post 34' above the passivation layer 14' is in a range from about 5 µm to about 60 µm. The height $H_3$ of the molding layer 26 above the passivation layer 14' in regions away from the copper post 34', such as above region 45', is in a range from about 15 µm to about 55 µm.

Figure 3A:
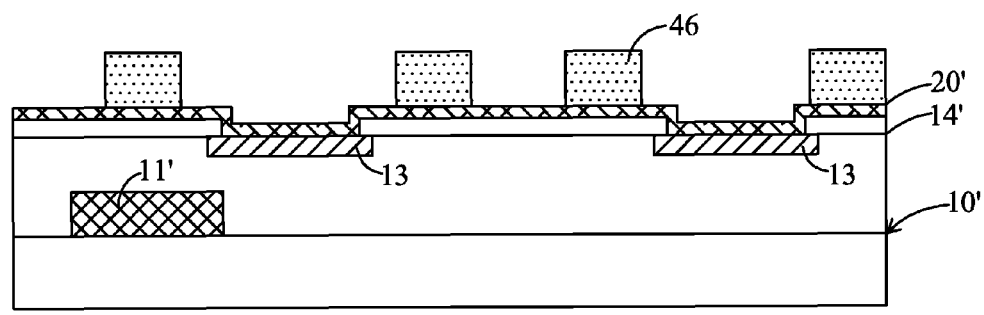
FIGS. 3A-3J depict cross-sectional views of a substrate undergoing sequential operation of forming the structures shown in FIGS. 2A and 2B, in accordance with some embodiments.

FIGS. 3A-3J depict cross-sectional views of substrate 10' undergoing sequential operations of forming the structures shown in FIGS. 2A and 2B, in accordance with some embodiments. FIG. 3A shows a passivation layer 14' formed on the substrate 10' and patterned to form a first opening exposing a portion of the conductive layer 13. Passivation layer 14' may be deposited by a chemical vapor deposition (CVD) process, such as plasma-enhanced CVD (PECVD) process. Substrate 10' is patterned with a photoresist layer and then the passivation layer 14' is etched to form the openings. Afterwards, UBM layer(s) 20' is deposited. The deposition of the UBM layer(s) 20' may be achieved by physical vapor deposition (PVD) or other applicable methods. A photoresist layer 46 is deposited and patterned following the deposition of the UBM layer 20'.

Figure 3B:
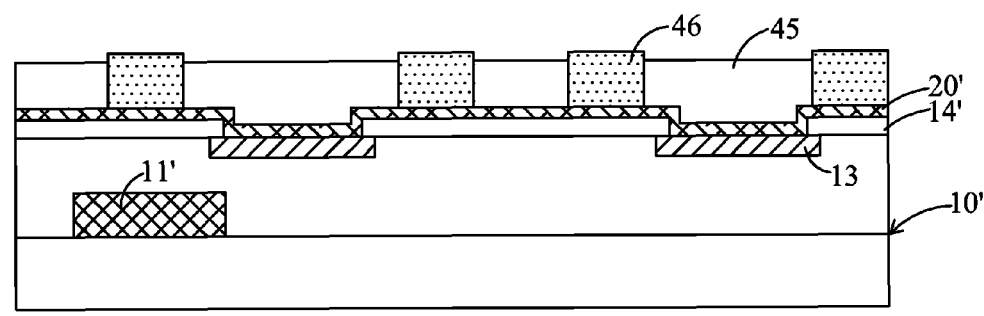
Figure 3C:
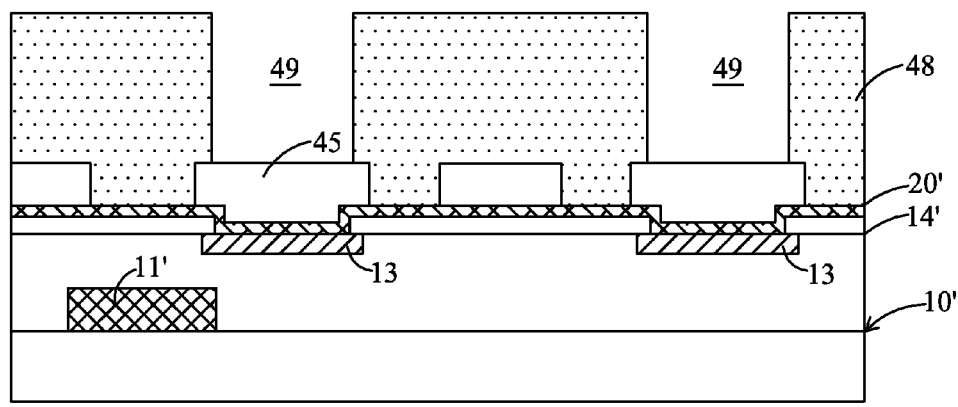
Figure 3D:
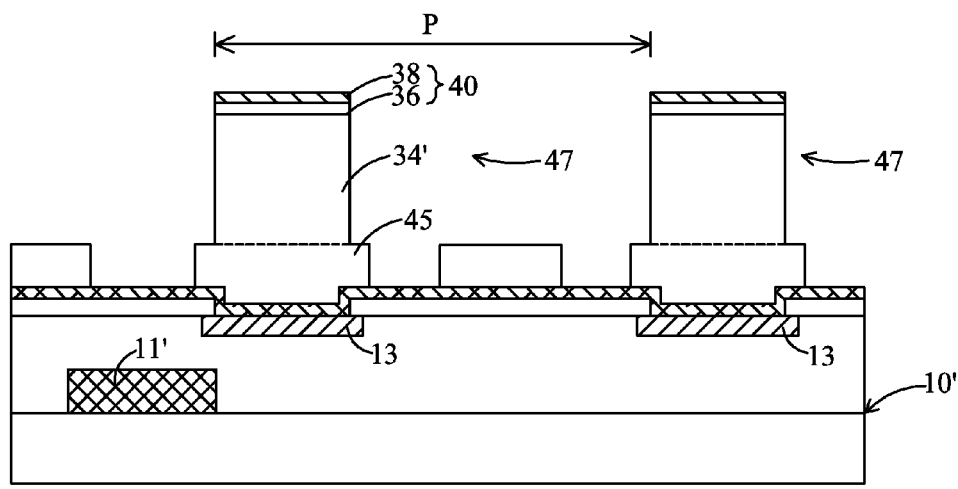
Figure 3E:
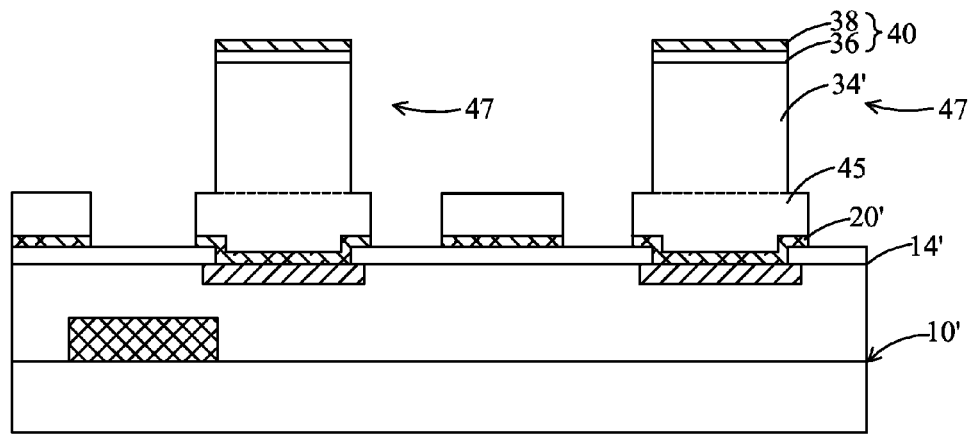

The conductive layer 45 is then deposited in the openings formed by photoresist layer 46, as shown in FIG. 3B in accordance with some embodiments. For example, the conductive layer 45 may be deposited by a plating process. After the conductive layer 45 is deposited, the photoresist layer 46 is removed and another photoresist layer 48 is deposited and patterned, as shown in FIG. 3C in accordance with some embodiments. An opening 49 formed by the photoresist layer 48 defines the space for forming the copper post 34'. FIG. 3D shows copper post 34' and capping layer 40 are formed in opening 49, such as by plating, in accordance with some embodiments. If conductive layer 45 is made of copper, copper post 34' can be plated directly over the conductive layer 45. FIG. 3D also shows the pitch P of bump structures 47. After the copper post 34' and capping layer 40 are formed, the photoresist layer 48 is removed. The exposed UBM layer(s) 20' is then removed by etching, as shown in FIG. 3E in accordance with some embodiments.

Figure 3F:
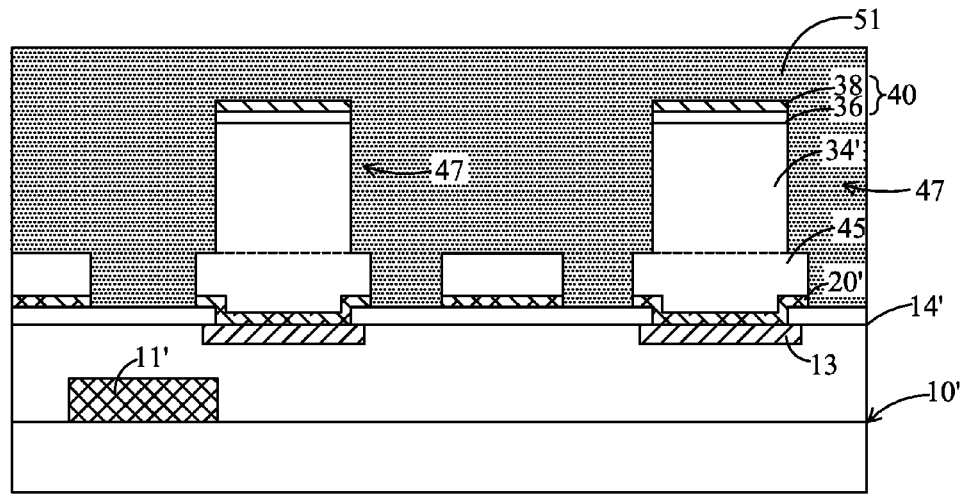
Figure 3G:
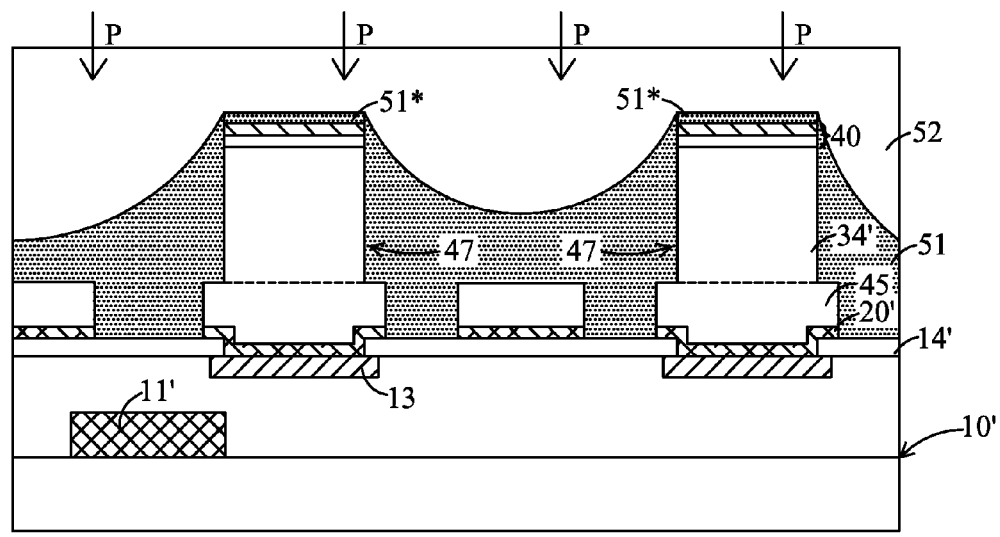
Figure 3H:
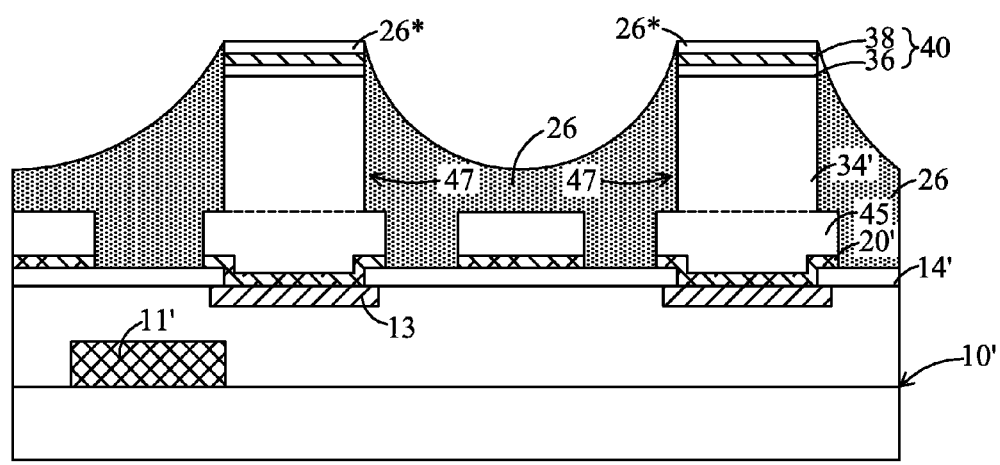

Afterwards, a liquid molding compound 51 is dispensed on substrate 10' to cover copper pillars 34', as shown in FIG. 3F in accordance with some embodiments. As mentioned above, the liquid molding compound 51 is a compound, which as a Young's modulus higher than 3.2 GPa after being dried. For example, the liquid molding compound 51 may be made of thermosetting plastics. An elastic film 52 is then pressed on the surface of liquid molding compound 51 against the substrate 10', as shown in FIG. 3G in accordance with some embodiments. In some embodiments, the elastic film 52 is made of Teflon, which is flexible and does not stick to liquid molding compound 51. Therefore, the elastic film 52 separates from liquid molding compound 51 to form the molding layer 26. A force P is applied on the elastic film 52 until the elastic film 52 is pressed against the capping layer 40 over the copper posts 34'. In some embodiments, the force in a range from about 200 kN (kilo Newton) to about 400 kN.

The liquid molding compound 51 is pressed until only a thin layer 51* of the liquid molding compound 51 is left on the copper post structures 47, which includes the copper posts 34' and the capping layer 40. In some embodiments, the thin layer 51* of the liquid molding compound has a thickness in a range from about 20 Angstroms to about 2000 Angstroms. FIG. 3G shows the pressed liquid molding compound 51 remains on the sidewalls of the copper bump (or post) structures 47 and covers the conductive layer 45, which does not have copper post 34' over it in accordance with some embodiments. However, the elastic film 52 may press against conductive layer 45', in some embodiments, and leave a thin layer of liquid molding compound over the conductive layer 45'.

After the applying pressure on the elastic film 52, the elastic film 52 is removed and substrate 10' is cured to drive out the volatile compounds, such as moisture or other organic compounds with low evaporation temperature, in the liquid molding compound 51 and the convert the liquid molding compound 51 into a solid and supportive molding layer 26. In some embodiments, the curing operation is conductive at a temperature in a range from about 100° C. to about 250° C. In some other embodiments, the curing temperature in a range from about 130° C. to about 180° C. The duration of the curing process is in a range from about 1 minute to about 10 minutes, in accordance with some embodiments. The curing operation helps set the shape/profile of the molding layer 26.

Figure 3I:
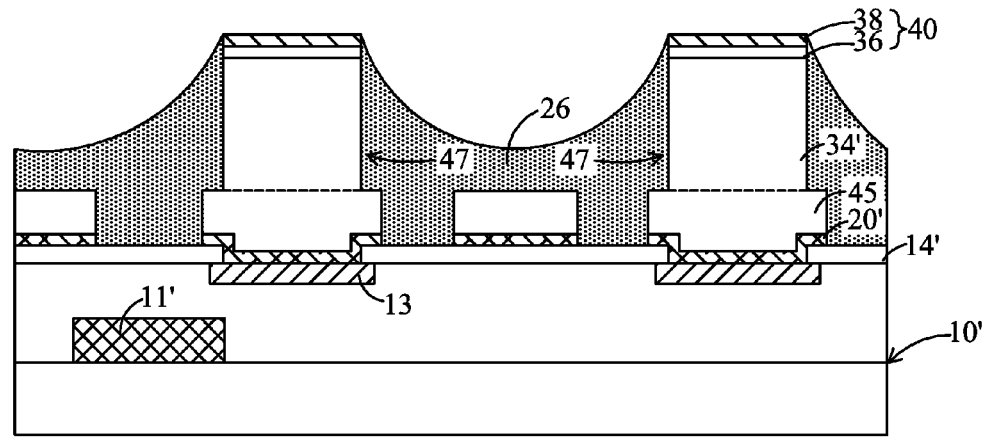

After the curing operation, a thin molding layer 26*, which is converted from thin layer 51*, over the copper bump structure 47 is removed by etching. Dry or wet etching may be used to remove the thin molding layer 26*. In some embodiment, the thin molding layer 26* over the copper bump structure 47 is removed by a plasma etching process. FIG. 3I shows the cross-sectional view of the packaged copper bump structure 47 on substrate 10' after the thin molding layer 26* has been removed. In some embodiments, the molding layer 26* covers the conductive layer 45.

Figure 3J:
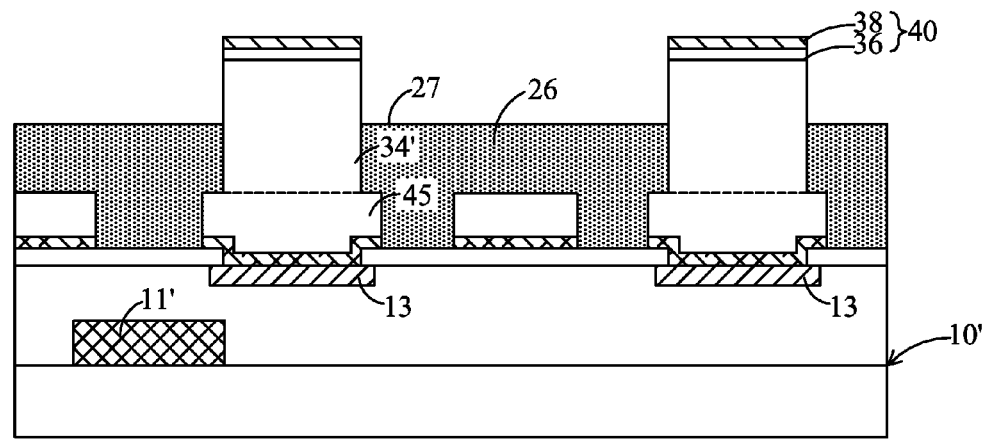

The process sequence described above associated with FIGS. 3A-3I is merely an embodiment. Other process sequences are also possible. For example, after the liquid molding compound 51 has been dispensed on substrate 10', substrate 10' can be cured first to turn the liquid molding compound 51 into molding layer 26. Afterwards, an etch may be performed to remove the molding layer 26 from the surfaces of the capping layer 40. The etch may also recreate a relatively flat surface 27 between the copper post structures 47, as shown in FIG. 3J in accordance with some embodiments.

The mechanisms of forming a copper post structures described above enable formation of copper post structures on a flat conductive surface. In addition, the copper post structures are supported by a molding layer with higher Young's modulus (or a harder material) than polyimide, which is often used to support copper posts. The copper post structures formed greatly reduce the risk of cracking of passivation layer and delamination of at the dielectric interface surrounding the copper post structures.

In some embodiments, a semiconductor device structure on a semiconductor substrate is provided. The semiconductor device structure includes an under-bump metallurgy (UBM) layer over the semiconductor substrate and a conductive layer formed over the UBM layer. The semiconductor device structure also includes a copper post formed directly over the conductive layer and a molding layer surrounding sidewalls of the copper post and covering the conductive layer under the copper post. The molding layer has a Young's modulus in a range from about 5 GPa to about 25 GPa.

In some other embodiments, a semiconductor device structure on a semiconductor substrate is provided. The semiconductor device structure includes an under-bump metallurgy (UBM) layer over the semiconductor substrate, and a conductive layer formed over the UBM layer. The semiconductor device structure also includes a copper post formed directly over the conductive layer, and a molding layer surrounding sidewalls of the copper post and covering the conductive layer under the copper post. The molding layer has a Young's modulus in a range from about 5 GPa to about 25 GPa. There is more than one copper posts on the semiconductor substrate and the pitch of the copper posts is in a range from about 40 µm to about 180 µm.

In yet some other embodiments, a method of forming copper post structure on a substrate is provided. The method includes forming a passivation layer over the substrate, and forming an UBM layer over the passivation layer. The passivation layer has an opening exposing a conductive region, and forming a conductive layer over the UBM layer. The method also includes forming a copper post structure over the conductive layer, and forming a molding layer to surround the copper post and the cover the conductive layer underneath the copper post. The molding layer has a Young's modulus in a range from about 5 GPa to about 20 GPa.

In the preceding detailed description, the disclosure is described with reference to specific exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concepts as expressed herein.

What is claimed is:

1. A semiconductor device structure on a semiconductor substrate, comprising:
    a passivation layer over the semiconductor substrate;
    an under-bump metallurgy (UBM) layer over the semiconductor substrate;
    a first conductive structure over the UBM layer;
    a copper post directly over the first conductive structure, wherein the copper post exposes a portion of a top surface of the first conductive structure;
    a molding layer surrounding sidewalls of the copper post, wherein the molding layer covers the exposed portion of the top surface of the first conductive structure, and, wherein a first portion of a top surface of the molding layer is curved, and a second portion of the top surface of the molding layer extends substantially parallel to a top surface of the semiconductor substrate; and
    a second conductive structure over the semiconductor substrate, wherein the second portion of the molding layer covers an entire top surface of the second conductive structure, the passivation layer separates the second conductive structure from the semiconductor substrate, and a top surface of the first conductive structure is substantially coplanar with the top surface of the second conductive structure.

2. The semiconductor device structure of claim 1, wherein the molding layer is made of thermosetting plastics.

3. The semiconductor device structure of claim 1, wherein a width of the copper post is in a range from about 10 µm to about 105 µm.

4. The semiconductor device structure of claim 1, wherein the semiconductor device structure comprises more than one copper posts and a pitch between the more than one copper posts is in a range from about 40 µm to about 180 µm.

5. The semiconductor device structure of claim 1, wherein the first conductive structure is a top metal layer or a redistribution layer.

6. The semiconductor device structure of claim 1, wherein a height of the molding layer surrounding the sidewalls of the copper post is in a range from about 5µm to about 60 µm above the structure conductive structure.

7. The semiconductor device structure of claim 1, wherein the first conductive structure under the copper post has a width equal to or wider than a width of the copper post.

8. The semiconductor device structure of claim 1, wherein a coefficient of thermal expansion of the molding layer is in a range from about 20 ppm/° C. to about 60 ppm/° C.

9. The semiconductor device structure of claim 1, wherein the molding layer contacts with the passivation layer.

10. The semiconductor device structure of claim 1, wherein the copper post lands completely on the first conductive structure.

11. The semiconductor device structure of claim 1, wherein a thickness of the passivation layer is uniform across an entirety of the passivation layer.

12. The semiconductor device structure of claim 1, wherein a second UBM layer is between the second conductive structure and the passivation layer, and the passivation layer directly contacts the semiconductor substrate.

13. A semiconductor device structure on a semiconductor substrate, comprising:
    a contact pad over the semiconductor substrate;
    a passivation layer extending over at least a portion of the contact pad, wherein an entirety of a top surface of the passivation layer is co-planar;
    an under-bump metallurgy (UBM) layer over a portion of the passivation layer;
    a conductive layer formed over the UBM layer;
    a copper post formed directly over the conductive layer, wherein the copper post exposes a portion of a top surface of the conductive layer, and the copper post is positioned directly above the contact pad and centered with respect to the contact pad;
    a second conductive layer separated from the conductive layer; and
    a molding layer surrounding sidewalls of the copper post, the molding layer contacts the exposed portion of the top surface of the conductive layer, the molding layer directly contacts the passivation layer, a top surface of a first portion of the molding layer is substantially parallel to the top surface of the passivation layer, the first portion of the molding layer is over the second conductive layer, and a second portion of the molding layer between the first portion and the copper post has a curved top surface,
    wherein the semiconductor device structure comprises more than one copper posts and a pitch of the more than one copper posts is in a range from about 40 µm to about 180 µm.

14. A method of forming a copper post structure on a substrate, comprising:
    forming a passivation layer over the substrate
    forming an UBM layer over the passivation layer, wherein the passivation layer has an opening exposing a conductive region;
    forming a conductive layer over the UBM layer;
    forming a copper post structure over the conductive layer, wherein forming the copper post structure comprises exposing a portion of a top surface of the conductive layer; and forming a molding layer to surround the copper post structure, cover a top surface of the copper post structure, wherein forming the molding layer includes covering the exposed portion of the top surface of the conductive layer, wherein a top surface of the molding layer has a discontinuous curve, a first portion of the top surface of the molding layer is curved, and a second portion of the top surface of the molding layer extends substantially parallel to a top surface of the substrate.

15. The method of claim 14, wherein forming the molding layer comprises;

depositing a liquid molding compound on the substrate;

shaping the liquid molding compound by using an elastic film and by pressing the elastic film against the copper post structure; and curing the liquid molding compound to form the molding layer.

16. The method of claim 15, further comprising:

removing a thin molding layer from the top surface of the copper post structure.

17. The method of claim 14, wherein the molding layer is made of thermosetting plastics.

18. The method of claim 14, wherein the coefficient of thermal expansion of the molding layer is in a range from about 20 ppm/° C. to about 60 ppm/° C.

19. The method of claim 14, wherein forming the molding layer comprises;

depositing a liquid molding compound on the substrate;

curing the liquid molding compound to form the molding layer; and etching a portion of the molding layer to expose the copper post structure.

20. The method of claim 14, wherein the copper post structure includes a copper post and a capping layer.

* * * * *